(12) United States Patent
Huang

(10) Patent No.: US 9,131,635 B2
(45) Date of Patent: Sep. 8, 2015

(54) MANUFACTURING METHOD OF SUBSTRATE STRUCTURE

(71) Applicant: Tzu-Wei Huang, Hsinchu County (TW)

(72) Inventor: Tzu-Wei Huang, Hsinchu County (TW)

(73) Assignee: Subtron Technology Co., Ltd., Hsinchu County (TW)

( * ) Notice: Subject to any disclaimer, the term of this patent is extended or adjusted under 35 U.S.C. 154(b) by 228 days.

(21) Appl. No.: 13/794,815

(22) Filed: Mar. 12, 2013

(65) Prior Publication Data

US 2014/0096382 A1    Apr. 10, 2014

(30) Foreign Application Priority Data

Oct. 8, 2012  (TW) .............................. 101137153 A

(51) Int. Cl.
*H05K 3/42* (2006.01)
*H05K 3/00* (2006.01)

(52) U.S. Cl.
CPC ................ *H05K 3/42* (2013.01); *H05K 3/0035* (2013.01); *H05K 3/0038* (2013.01); *H05K 3/427* (2013.01); *H05K 2203/1476* (2013.01); *Y10T 29/49165* (2015.01)

(58) Field of Classification Search
CPC ..... H05K 3/0035; H05K 3/0038; H05K 3/42; H05K 3/427; H05K 2203/1476; Y10T 29/49165
USPC ............................................ 29/830, 846, 852
See application file for complete search history.

(56) References Cited

FOREIGN PATENT DOCUMENTS

| CN | 102307437 | * | 1/2012 |
| JP | 2008235801 A | * | 10/2008 |
| TW | 489586 | | 6/2002 |
| TW | 201101954 | | 1/2011 |
| WO | 2012101984 | * | 2/2012 |
| WO | WO2012101985 | * | 2/2012 |

OTHER PUBLICATIONS

"Office Action of Taiwan Counterpart Application", issued on May 14, 2014, p. 1-p. 7, in which the listed references were cited.

* cited by examiner

*Primary Examiner* — Carl Arbes
(74) *Attorney, Agent, or Firm* — Jianq Chyun IP Office

(57) ABSTRACT

A manufacturing method of substrate structure is provided. The base material having a core layer and a first and second copper foil layers located at a first and second surfaces of the core layer is provided. A surface treatment is performed on the first and second copper foil layers so as to form a first and second roughened surfaces. A laser beam is irradiated on the first roughened surface so as to form at least one first blind hole extending from the first copper foil layer to the second surface. An etching process is performed on the second copper foil layer so as to form at least one second blind hole extending from the second copper foil layer to the second surface. A conductive layer fills up a through hole defined by the first and second blind holes and covers the first and second copper foil layers.

10 Claims, 2 Drawing Sheets

MANUFACTURING METHOD OF SUBSTRATE STRUCTURE

CROSS-REFERENCE TO RELATED APPLICATION

This application claims the priority benefit of Taiwan application serial no. 101137153, filed on Oct. 8, 2012. The entirety of the above-mentioned patent application is hereby incorporated by reference herein and made a part of this specification.

TECHNICAL FIELD

The invention relates to a manufacturing method of a substrate structure, and more particularly, to a manufacturing method of a substrate structure having a through hole structure.

BACKGROUND

Nowadays, multi-layer circuit boards having at least two circuit layers usually have a conductive through hole structure, and the conductive through hole structure is electrically connected to two of the circuit layers in the multi-layer circuit board, such that the circuit layers are electrically conducted. Currently, most of the methods for forming the conductive through hole structure are firstly utilized the mechanical and etching methods to form through vias, and then the conductive through hole structure is completed by a plating through hole (PTH).

Generally speaking, if a mechanical drilling method is applied to form the through vias, the aperture of the formed through vias will be larger, which are not suitable for mass production. If the etching method cooperated with the mechanical drilling method is applied to form the through vias, firstly, the step of photoresist coating, exposure, development and etching will be performed twice to copper foil layers located on the two opposite surfaces of a resin layer, and then openings are formed on the copper foil layers so as to form through holes penetrating through the resin layer at the locations of the openings by the mechanical drill. Although the through vias formed by such method have smaller aperture, the step of photoresist coating, exposure, development and etching will have to be performed twice to form the openings on the copper foil layers, so that the manufacturing steps are more complicated. Thus, improving the manufacture of the substrate structure having the through hole structure so as to further reduce the manufacturing steps and enhance the production yield, is currently one of the major issues needed to be overcome.

SUMMARY

Accordingly, the invention is directed to a manufacturing method of a substrate structure, capable of reducing manufacturing steps and manufacturing costs.

The invention provides a manufacturing method of a substrate structure. The method includes the following steps. A base material is provided. The base material has a core layer, and a first copper foil layer and a second copper foil layer located at a first surface and a second surface of the core layer, where the first surface and the second surface are opposite to each other. A surface treatment is performed on the first copper foil layer and the second copper foil layer, so as to form a first roughened surface and a second roughened surface respectively on the first copper foil layer and the second copper foil layer. A laser beam is irradiated on the first roughened surface of the first copper foil layer, so as to form at least one first blind hole extending from the first copper foil layer to the second surface of the core layer. An etching process is performed on the second copper foil layer, so as to form at least one second blind hole extending from the second copper foil layer to the second surface of the core layer. The second blind hole connects with the first blind hole to constitute of at least one through hole. A conductive layer is formed on the first copper foil layer and the second copper foil layer, wherein the conductive layer fills up the through hole and covers the first copper foil layer and the second copper foil layer.

In an embodiment of the invention, the surface treatment includes a brown oxidation treatment or a roughening treatment.

In an embodiment of the invention, a method of forming the conductive layer includes an electroplating.

In an embodiment of the invention, an aperture of the second blind hole and an aperture of the first blind hole are the same.

In an embodiment of the invention, the aperture of the first blind hole is between 75 μm and 150 μm.

In an embodiment of the invention, the manufacturing method of the substrate structure further includes a following step. An electroplating seed layer s formed on the first copper foil layer, the second copper foil layer and inner walls of the through hole before the conductive layer is formed.

In an embodiment of the invention, a ten-point average roughness (Rz) of the first roughened surface is between 3.5 μm and 4.5 μm.

In an embodiment of the invention, a ten-point average roughness (Rz) of the second roughened surface is between 3.5 μm and 4.5 μm.

In an embodiment of the invention, a material of the core layer includes resin.

In an embodiment of the invention, a material of the conductive layer includes copper.

Based on the above, in the invention, the surface treatment is firstly performed on the copper foil layers, and then the process of irradiating the laser beam and the etching process are sequentially performed on the copper foil layers after the surface treatment, so as to form the through holes. Therefore, compared to the conventional technique (that is applying the etching method cooperated with the mechanical drilling method to form the through hole structure), the manufacturing method of the substrate structure in the invention may reduce the step of photoresist coating, exposure, development and etching once, which mean the manufacturing steps may be reduced effectively, so that the manufacturing costs may be reduced, and such manufacturing method is suitable for mass production.

In order to make the aforementioned features and advantages of the invention more comprehensible, embodiments accompanying figures are described in details below.

BRIEF DESCRIPTION OF THE DRAWINGS

The accompanying drawings are included to provide further understanding and are incorporated in and constitute a part of this specification. The drawings illustrate exemplary embodiments and, together with the description, serve to explain the principles of the invention.

DESCRIPTION OF THE EMBODIMENTS

Figure 1A:
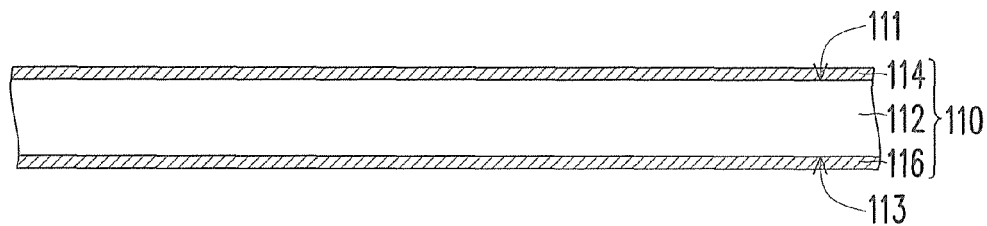
FIG. 1A through FIG. 1E are schematic cross-sectional views of a manufacturing method of a substrate structure according to an embodiment of the invention.

FIG. 1A through FIG. 1E are schematic cross-sectional views of a manufacturing method of a substrate structure according to an embodiment of the invention. According to the manufacturing method of the substrate structure in the embodiment, referring to FIG. 1A, a base material 110 is firstly provided, wherein the base material 110 has a core layer 112, a first copper foil layer 114 and a second copper foil layer 116. In the embodiment, the core layer 112 has a first surface 111 and a second surface 113 that are opposite to each other. The first copper foil layer 114 and the second copper foil layer 116 are located on the first surface 111 and the second surface 113 of the core layer 112, respectively. Herein, a material of the core layer 112 is, for example, resin.

Figure 1B:
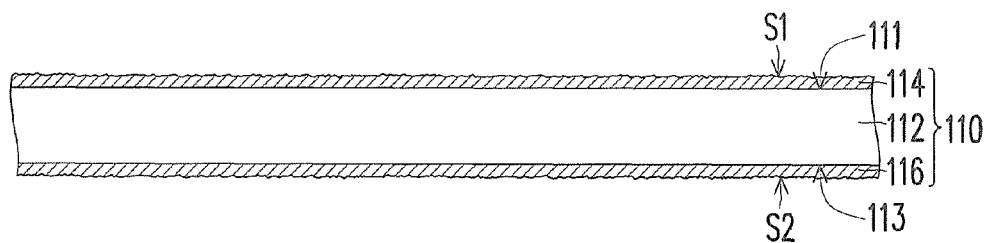

Subsequently, referring to FIG. 1B, a surface treatment is performed on the first copper foil layer 114 and the second copper foil layer 116, so as to form a first roughened surface Si and a second roughened surface S2 respectively on the first copper foil layer 114 and the second copper foil layer 116. In the embodiment, the surface treatment is, for example, a brown oxidation treatment or a roughening treatment, wherein a ten-point average roughness (Rz) of the first roughened surface S1 is between 3.5 μm and 4.5 μm, and a ten-point average roughness (Rz) of the second roughened surface S2 is between 3.5 μm and 4.5 μm.

Figure 1C:
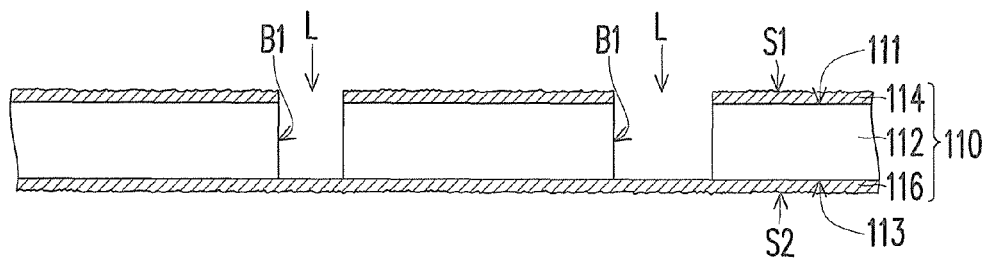

Subsequently, referring to FIG. 1C, a laser beam L is irradiated on the first roughened surface S1 of the first copper foil layer 114, so as to form at least one first blind hole B1 extending from the first copper foil layer 114 to the second surface 113 of the core layer 112. Herein, the first blind holes B1 expose a portion of the second copper foil layer 116, wherein the aperture of the first blind hole B1 is between 75 μm and 150 μm.

Since the surface treatment is firstly performed on the first copper foil layer 114 and the second copper foil layer 116 to increase the surface roughness, a preferable manufacturing reliability may be obtained when the laser beam L is irradiated.

Figure 1D:
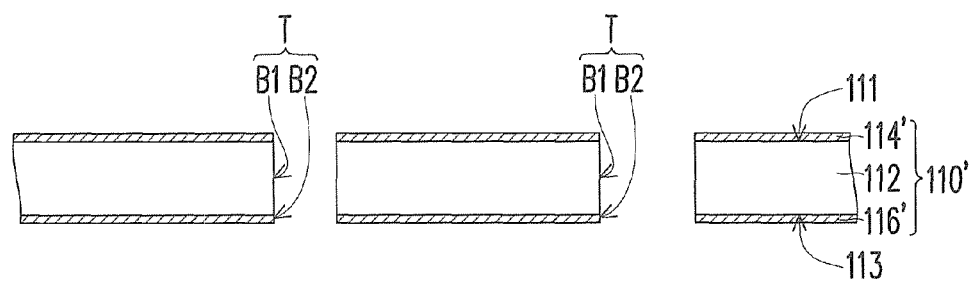

Subsequently, referring to FIG. 1C and FIG. 1D together, an etching process is performed on the second copper foil layer 116, so as to form at least one second blind hole B2 extending from the second copper foil layer 116' to the second surface 113 of the core layer 112. Herein, the second blind holes B2 connect with the first blind holes B1 so as to constitute of at least one through hole T, wherein the aperture of the second blind hole B2 and the aperture of the first blind hole B1 are substantially the same. It should be noted that, when the etching process is performed, an etchant (not shown) may simultaneously etch the first copper foil layer 114, the second copper foil layer 116, the first roughened surface Si and the second roughened surface S2, such that the thickness of the first copper foil layer 114 and the thickness of the second copper foil layer 116 are decreased, so as to constitute of a base material 110' having a first copper foil layer 114' and a second copper foil layer 116', where the thicknesses of the first copper foil layer 114' and the second copper foil layer 116' are thinner.

Figure 1E:
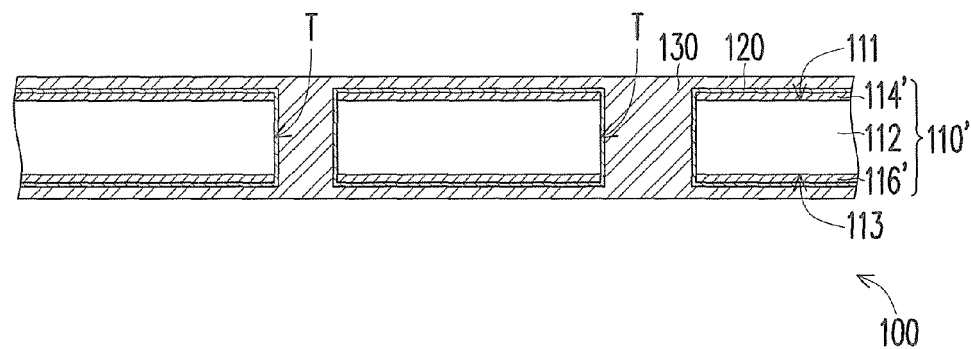

Thereafter, referring to FIG. 1E, an electroplating seed layer 120 is formed on the first copper foil layer 114', the second copper foil layer 116' and inner walls of the though holes T, wherein the electroplating seed layer 120 covers the first copper foil layer 114', the second copper foil layer 116' and the inner walls of the though holes T. Finally, a conductive layer 130 is formed on the electroplating seed layer 120 located at the first copper foil layer 114' and the second copper foil layer 116', wherein the conductive layer 130 fills up the through holes T and covers the electroplating seed layer 120 located at the first copper foil layer 114', the second copper foil layer 116' and the inner walls of the through holes T. Herein, the method of forming the conductive layer 130 is, for example, an electroplating, and a material of the conductive layer 130 is, for example, copper. To this point, the manufacturing method of the substrate structure 100 is completed.

In the embodiment, the surface treatment is firstly performed on the first copper foil layer 114 and the second copper foil layer 116, and then the laser beam L is irradiated on the first copper foil layer 114 and the etching process is performed on the second copper foil layer 116 after the surface treatment, so as to form the through holes T. Therefore, compared to the conventional technique (that is applying the etching method cooperated with the mechanical drilling method to form the through hole structure), the manufacturing method of the substrate structure in the embodiment may reduce the step of photoresist coating, exposure, development and etching once, which mean the manufacturing steps may be reduced effectively, so that the manufacturing costs may be reduced, and such manufacturing method is suitable for mass production. Furthermore, in the embodiment, the laser beam L is irradiated firstly and the etching process is then performed so as to form the through holes T, and therefore, compared to the conventional technique (that is applying the mechanical drilling method to form the through hole structure), the through holes T of the embodiment may obtain a preferable manufacturing tolerance margin during the manufacturing process, and the through holes T may also have smaller aperture, which are suitable for mass production.

To sum up, in the invention, the surface treatment is firstly performed on the copper foil layers, and then the process of irradiating the laser beam and the etching process are sequentially performed on the copper foil layers after the surface treatment, so as to form the through holes. Therefore, compared to the conventional technique (that is applying the etching method cooperated with the mechanical drilling method to form the through hole structure), the manufacturing method of the substrate structure in the invention may reduce the step of photoresist coating, exposure, development and etching once, which mean the manufacturing steps may be reduced effectively, so that the manufacturing costs may be reduced, and such manufacturing method is suitable for mass production.

It will be apparent to those skilled in the art that the descriptions above are several preferred embodiments of the invention only, which does not limit the implementing range of the invention. Various modifications and variations can be made to the structure of the invention without departing from the scope or spirit of the invention. The claim scope of the invention is defined by the claims hereinafter.

What is claimed is:

1. A manufacturing method of a substrate structure, comprising:
    providing a base material, wherein the base material has a core layer, and a first copper foil layer and a second copper foil layer located at a first surface and a second surface of the core layer, where the first surface and the second surface are opposite to each other;
    performing a surface treatment on the first copper foil layer and the second copper foil layer, so as to form a first roughened surface and a second roughened surface respectively on the first copper foil layer and the second copper foil layer;
    irradiating a laser beam on the first roughened surface of the first copper foil layer, so as to form at least one first blind hole extending from the first copper foil layer to the second surface of the core layer;

performing an etching process on the second copper foil layer, so as to form at least one second blind hole extending from the second copper foil layer to the second surface of the core layer, wherein the second blind hole connects with the first blind hole to constitute of at least one through hole; and forming a conductive layer on the first copper foil layer and the second copper foil layer, wherein the conductive layer fills up the through hole and covers the first copper foil layer and the second copper foil layer.

2. The manufacturing method of the substrate structure as claimed in claim 1, wherein the surface treatment comprises a brown oxidation treatment or a roughening treatment.

3. The manufacturing method of the substrate structure as claimed in claim 1, wherein a method of forming the conductive layer comprises an electroplating.

4. The manufacturing method of the substrate structure as claimed in claim 1, wherein an aperture's diameter of the second blind hole and an aperture's diameter of the first blind hole are the same.

5. The manufacturing method of the substrate structure as claimed in claim 4, wherein the aperture of the first blind hole is between 75 μm and 150 μm.

6. The manufacturing method of the substrate structure as claimed in claim 1, further comprising:

forming an electroplating seed layer on the first copper foil layer, the second copper foil layer and inner walls of the through hole before forming the conductive layer.

7. The manufacturing method of the substrate structure as claimed in claim 1, wherein a ten-point average roughness of the first roughened surface is between 3.5 μm and 4.5 μm.

8. The manufacturing method of the substrate structure as claimed in claim 1, wherein a ten-point average roughness of the second roughened surface is between 3.5 μm and 4.5 μm.

9. The manufacturing method of the substrate structure as claimed in claim 1, wherein a material of the core layer comprises resin.

10. The manufacturing method of the substrate structure as claimed in claim 1, wherein a material of the conductive layer comprises copper.

* * * * *